(12) United States Patent
Watanabe et al.

(10) Patent No.: US 10,024,907 B2
(45) Date of Patent: Jul. 17, 2018

(54) SEMICONDUCTOR DEVICE AND MANUFACTURING METHOD OF SEMICONDUCTOR DEVICE

(71) Applicant: Toshiba Memory Corporation, Tokyo (JP)

(72) Inventors: Shinya Watanabe, Oita Oita (JP); Toshihiro Nambu, Yokohama Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/055,159

(22) Filed: Feb. 26, 2016

(65) Prior Publication Data
US 2016/0351492 A1    Dec. 1, 2016

(30) Foreign Application Priority Data

May 29, 2015    (JP) ................. 2015-110844

(51) Int. Cl.
*H01L 23/498*    (2006.01)
*G01R 31/28*    (2006.01)
(Continued)

(52) U.S. Cl.
CPC .... *G01R 31/2856* (2013.01); *H01L 21/76898* (2013.01); *H01L 22/32* (2013.01); *H01L 23/3128* (2013.01); *H01L 23/3135* (2013.01); *H01L 23/481* (2013.01); *H01L 23/5226* (2013.01); *H01L 23/53209* (2013.01); *H01L 23/53214* (2013.01); *H01L 23/53228* (2013.01);
(Continued)

(58) Field of Classification Search
CPC ............ H01L 23/481; H01L 23/49827; H01L 23/5226
See application file for complete search history.

(56) References Cited

U.S. PATENT DOCUMENTS 7,808,064 B2    10/2010    Kawasaki et al.
2011/0207322 A1*   8/2011    Yamaguchi ........... H01L 23/481
                                                                          438/667
(Continued)

FOREIGN PATENT DOCUMENTS

JP    2005-276877 A    10/2005
JP    2007251022 A     9/2007
(Continued)

OTHER PUBLICATIONS

Taiwan Office Action dated Jan. 10, 2017, filed in Taiwan counterpart Application No. 104138285, 8 pages (with translation).
(Continued)

*Primary Examiner* — Cuong Q Nguyen
(74) *Attorney, Agent, or Firm* — Patterson & Sheridan, LLP

(57) ABSTRACT

A through electrode and a multilayer wiring are provided on a semiconductor substrate, and a bottom layer connection wiring, a lower layer connection wiring, an upper layer connection wiring, and a top layer connection wiring are provided in the multilayer wiring. The through electrode is connected to the bottom layer connection wiring, and a via is arranged at a position other than a position immediately above the through electrode.

18 Claims, 12 Drawing Sheets

(51) Int. Cl.
*H01L 23/48* (2006.01)
*H01L 23/532* (2006.01)
*H01L 23/522* (2006.01)
*H01L 21/768* (2006.01)
*H01L 23/31* (2006.01)
*H01L 21/66* (2006.01)
*H01L 23/00* (2006.01)
*H01L 27/11529* (2017.01)
*H01L 23/538* (2006.01)
*H01L 25/065* (2006.01)

(52) U.S. Cl.
CPC ........ *H01L 23/53257* (2013.01); *H01L 24/05* (2013.01); *H01L 24/06* (2013.01); *H01L 23/49816* (2013.01); *H01L 23/5384* (2013.01); *H01L 24/13* (2013.01); *H01L 24/16* (2013.01); *H01L 24/17* (2013.01); *H01L 24/29* (2013.01); *H01L 25/0657* (2013.01); *H01L 27/11529* (2013.01); *H01L 2224/0401* (2013.01); *H01L 2224/056* (2013.01); *H01L 2224/05009* (2013.01); *H01L 2224/05012* (2013.01); *H01L 2224/05017* (2013.01); *H01L 2224/05082* (2013.01); *H01L 2224/05083* (2013.01); *H01L 2224/05093* (2013.01); *H01L 2224/05095* (2013.01); *H01L 2224/05096* (2013.01); *H01L 2224/05155* (2013.01); *H01L 2224/05166* (2013.01); *H01L 2224/05569* (2013.01); *H01L 2224/05611* (2013.01); *H01L 2224/05616* (2013.01); *H01L 2224/05639* (2013.01); *H01L 2224/05644* (2013.01); *H01L 2224/05647* (2013.01); *H01L 2224/05655* (2013.01); *H01L 2224/0601* (2013.01); *H01L 2224/06181* (2013.01); *H01L 2224/10135* (2013.01); *H01L 2224/131* (2013.01); *H01L 2224/13111* (2013.01); *H01L 2224/13116* (2013.01); *H01L 2224/13139* (2013.01); *H01L 2224/13144* (2013.01); *H01L 2224/13147* (2013.01); *H01L 2224/13155* (2013.01); *H01L 2224/16113* (2013.01); *H01L 2224/16145* (2013.01); *H01L 2224/16146* (2013.01); *H01L 2224/16227* (2013.01); *H01L 2224/1703* (2013.01); *H01L 2224/17181* (2013.01); *H01L 2224/27334* (2013.01); *H01L 2224/2919* (2013.01); *H01L 2224/32245* (2013.01); *H01L 2224/73204* (2013.01); *H01L 2224/73253* (2013.01); *H01L 2224/81139* (2013.01); *H01L 2224/81444* (2013.01); *H01L 2224/81447* (2013.01); *H01L 2224/97* (2013.01); *H01L 2924/014* (2013.01); *H01L 2924/0105* (2013.01); *H01L 2924/01028* (2013.01); *H01L 2924/01029* (2013.01); *H01L 2924/0132* (2013.01); *H01L 2924/01046* (2013.01); *H01L 2924/01047* (2013.01); *H01L 2924/01079* (2013.01); *H01L 2924/01404* (2013.01); *H01L 2924/1438* (2013.01); *H01L 2924/15311* (2013.01); *H01L 2924/15747* (2013.01); *H01L 2924/3511* (2013.01)

(56) References Cited

U.S. PATENT DOCUMENTS

| | | | |
|---|---|---|---|
| 2013/0099349 A1* | 4/2013 | Nomachi | H01L 23/481 257/506 |
| 2013/0157456 A1 | 6/2013 | Hill et al. | |
| 2014/0284690 A1* | 9/2014 | Arai | H01L 23/481 257/324 |

FOREIGN PATENT DOCUMENTS

| | | |
|---|---|---|
| JP | 2008053624 A | 3/2008 |
| JP | 2008171924 A | 7/2008 |
| JP | 2009-158862 A | 7/2009 |
| JP | 2014-107308 A | 6/2014 |
| TW | 201208017 A | 2/2012 |
| TW | 201419483 A | 5/2014 |
| TW | 201517235 A | 5/2015 |

OTHER PUBLICATIONS

Notification of Reasons for Refusal dated May 8, 2018 in corresponding Japanese Patent Application No. 2015-110844 with English translation, 12 pages.

* cited by examiner

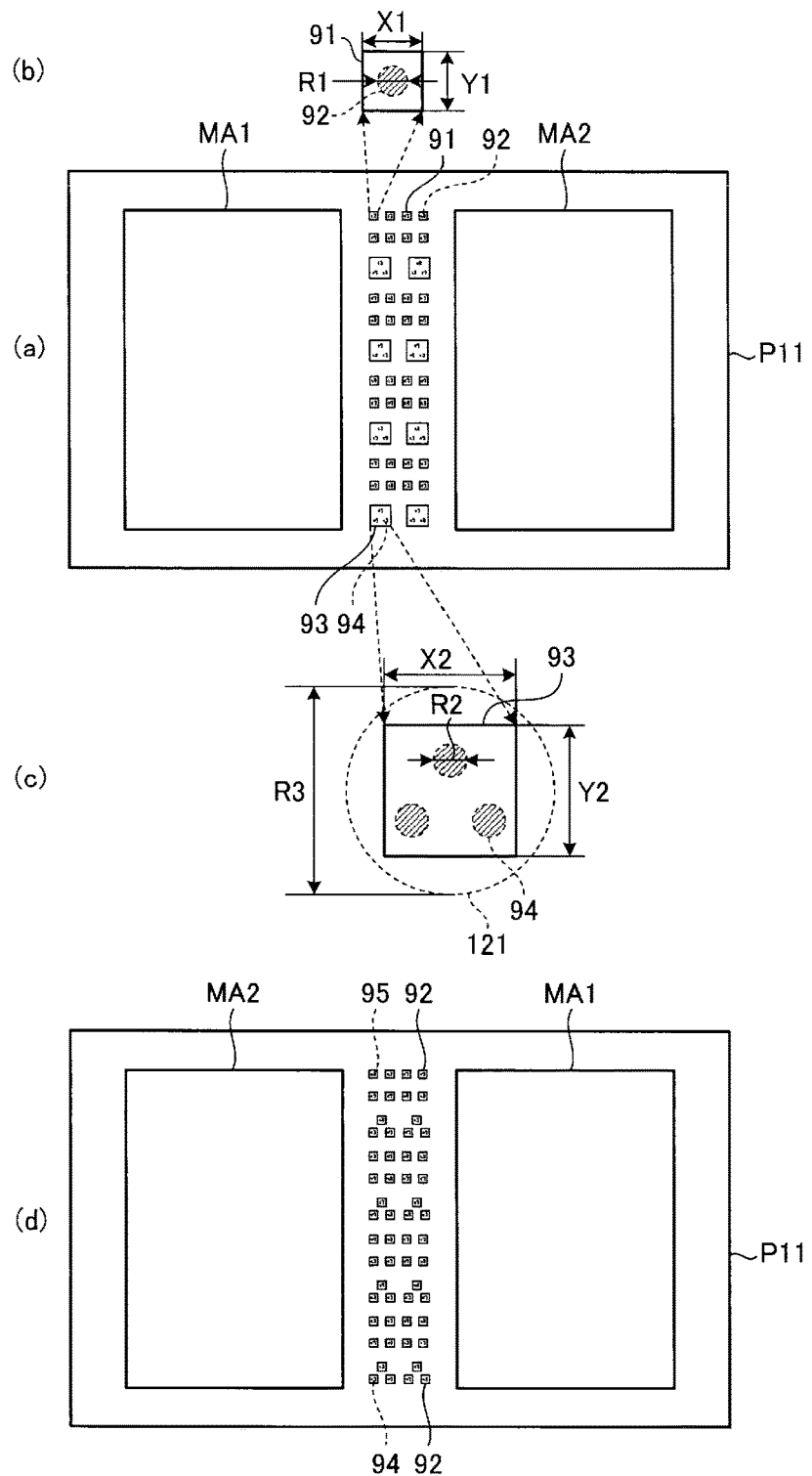

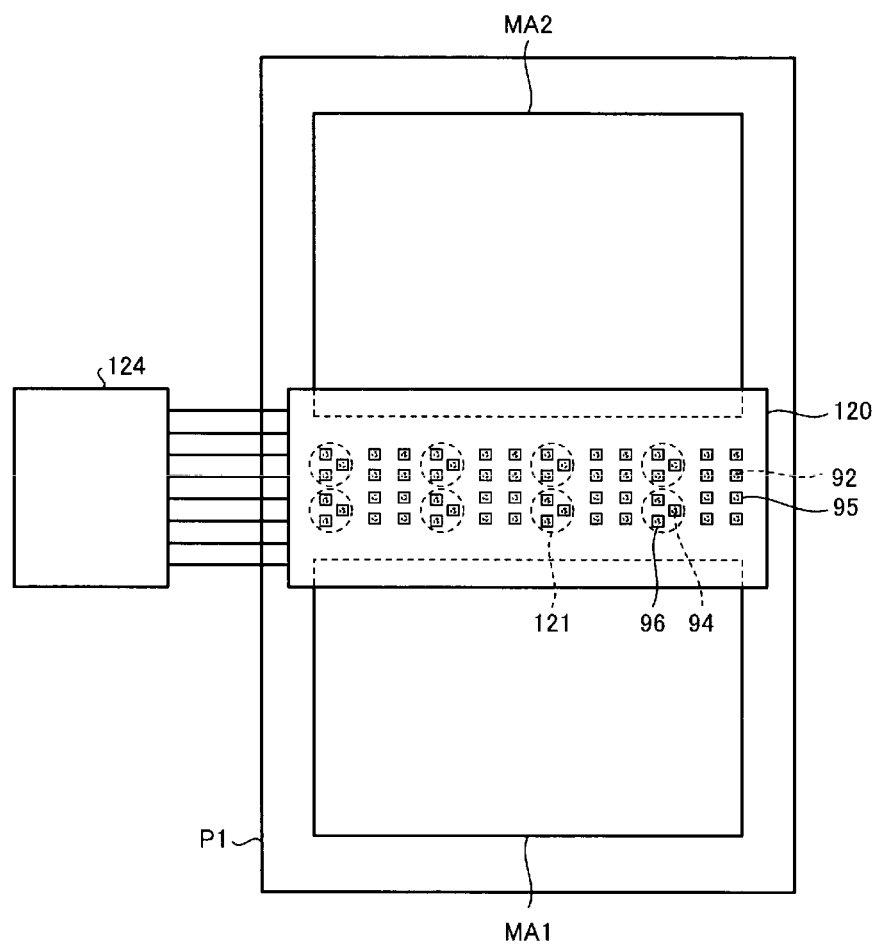

SEMICONDUCTOR DEVICE AND MANUFACTURING METHOD OF SEMICONDUCTOR DEVICE

CROSS-REFERENCE TO RELATED APPLICATION

This application is based upon and claims the benefit of priority from Japanese Patent Application No. 2015-110844 filed May 29, 2015, the entire contents of which are incorporated herein by reference.

FIELD

Embodiments described herein relate generally to a semiconductor device and a manufacturing method of a semiconductor device.

BACKGROUND

In the related art, in order to save space and to increase performance and capacity of a semiconductor device, a stacked body of semiconductor chips is used. A through electrode commonly referred to as a through silicon via (TSV) is used for electrical connection between the stacked semiconductor chips.

(a) of FIG. 8 is a plan view illustrating a layout example of a front-surface test pad of a semiconductor device according to a fourth embodiment, (b) of FIG. 8 is an enlarged plan view illustrating a front surface electrode of the semiconductor device according to the fourth embodiment, (c) of FIG. 8 is an enlarged plan view illustrating a front-surface test pad of the semiconductor device according to the fourth embodiment, and (d) of FIG. 8 is a plan view illustrating a layout example of a back-surface test pad of the semiconductor device according to the fourth embodiment.

Figure 9:
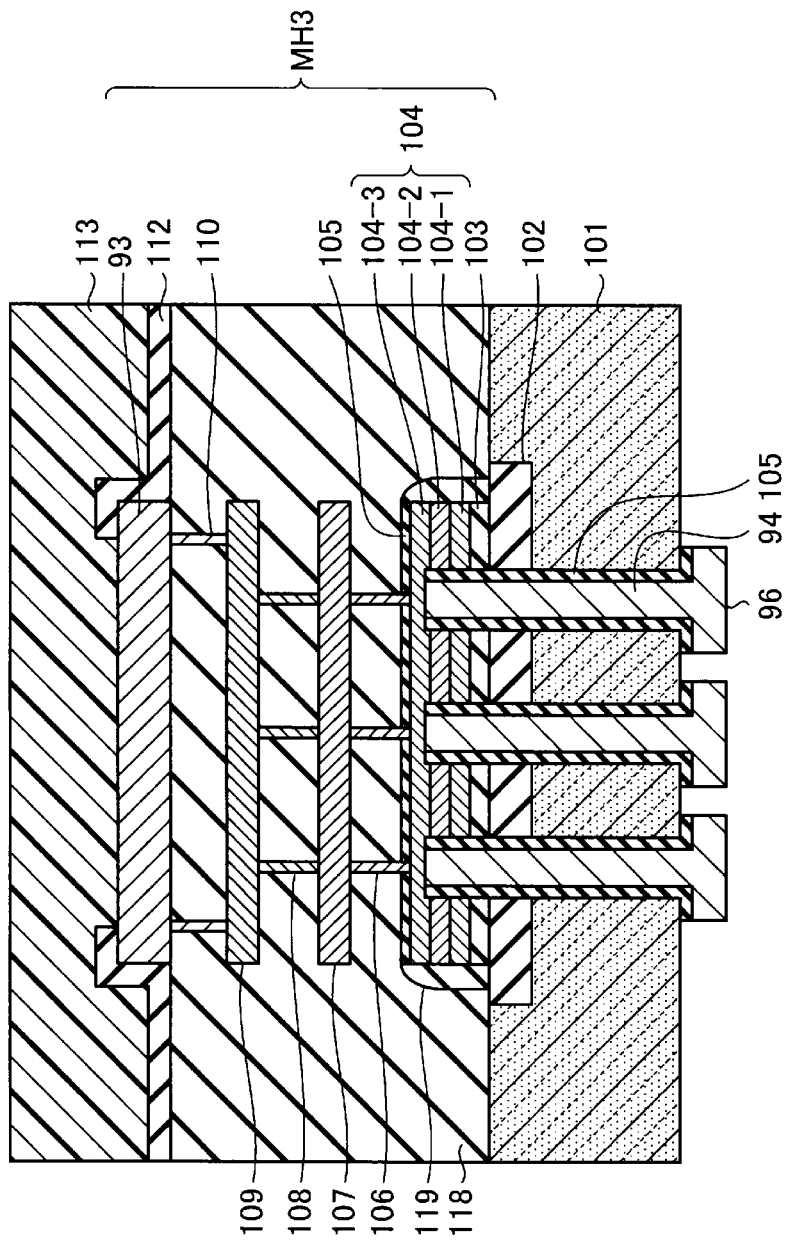

FIG. 9 is a sectional view illustrating an example of a connection structure of the front-surface test pad in portion (c) of FIG. 8 with the through electrodes.

Figure 10B:
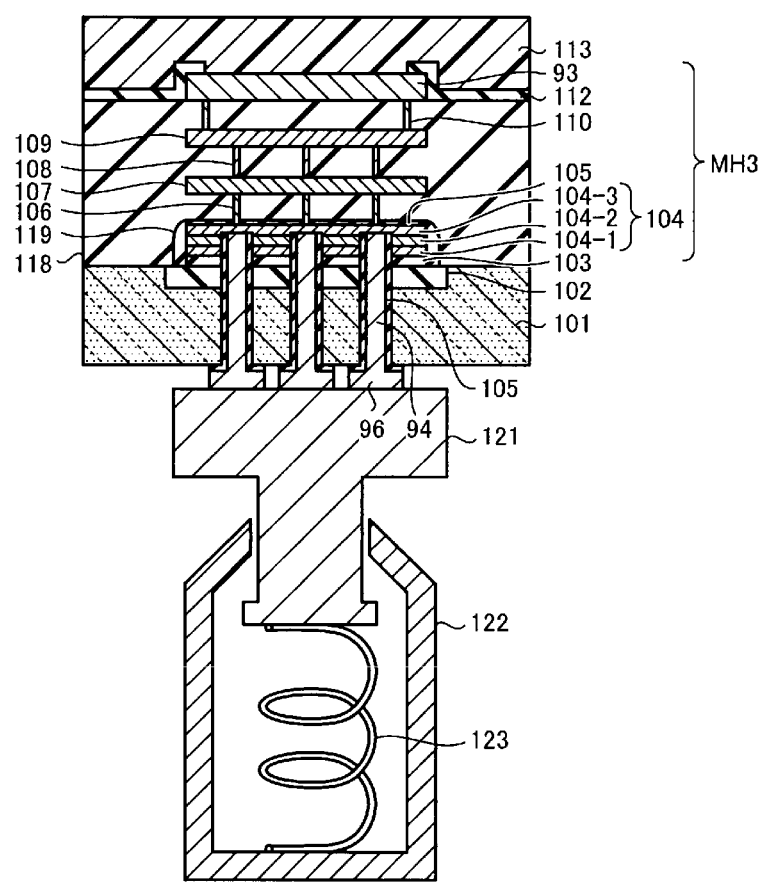

FIG. 10A is a plan view illustrating a method of arranging a probe card during a test in the semiconductor device according to the fourth embodiment, and FIG. 10B is an enlarged sectional view illustrating a contact state of a probe pin in FIG. 10A.

DETAILED DESCRIPTION

Provided are a semiconductor device and a method of manufacturing a semiconductor device, for which the degree of freedom of a wiring layout of a semiconductor chip having a through electrode may be improved.

In general, according to one embodiment, a semiconductor device includes a semiconductor chip, a multilayer wiring, and a through electrode. The multilayer wiring is provided in the semiconductor chip. The through electrode penetrates the semiconductor chip, and is bonded to the bottom wiring layer of the multilayer wiring.

Hereinafter, a semiconductor device and a manufacturing method of a semiconductor device according to embodiments will be described in detail with reference to the drawings. In addition, the embodiments do not limit the present invention.

First Embodiment

Figure 1:
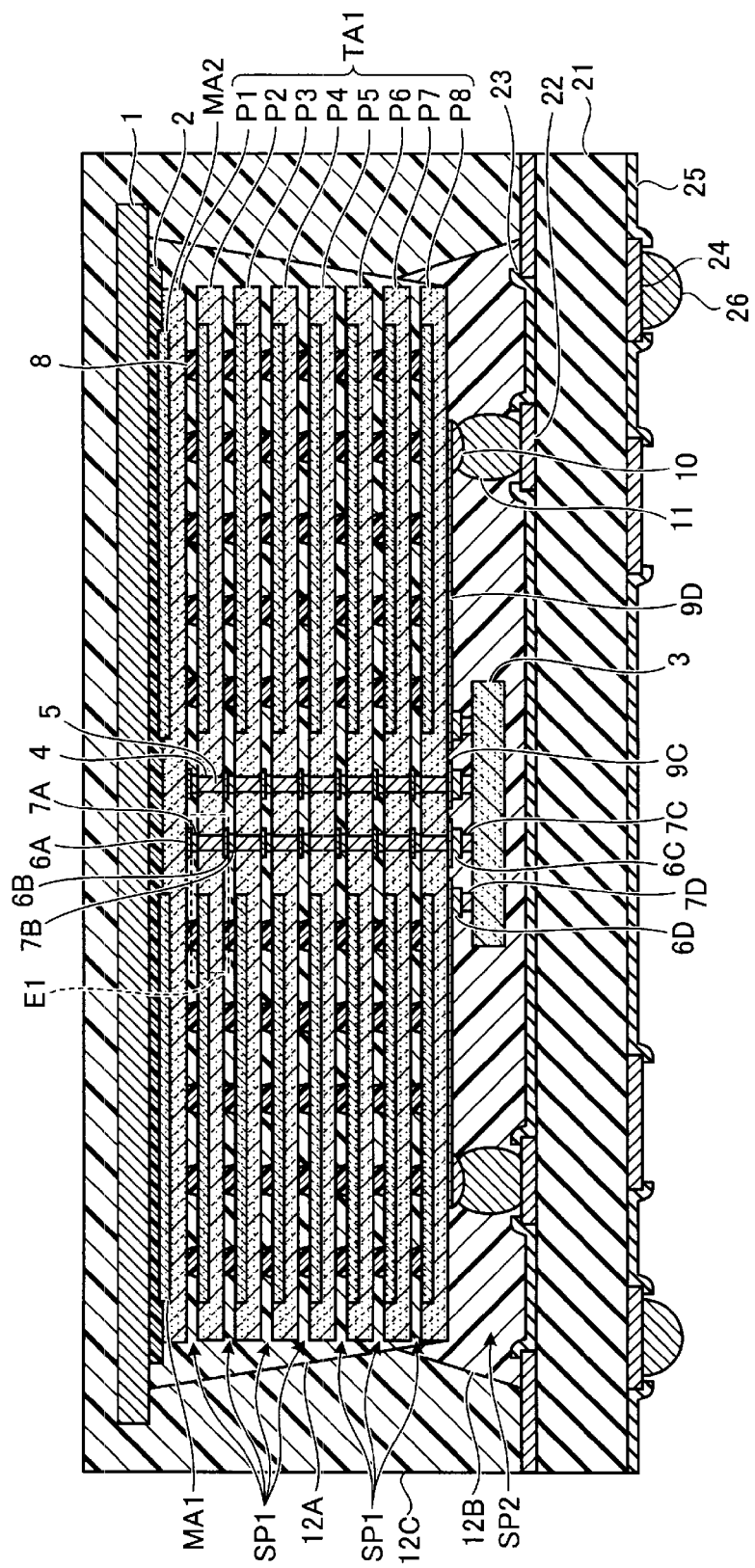
FIG. 1 is a sectional view illustrating a schematic configuration of a semiconductor device according to a first embodiment.

FIG. 1 is a sectional view illustrating a schematic configuration of a semiconductor device according to a first embodiment. In addition, in the following embodiment, although a configuration in which eight layers of semiconductor chips are stacked one upon the other is used as an example, a configuration in which N (N is an integer of 2 or more) layers of semiconductor chips are stacked one upon the other is possible. Further, in the following embodiment, although a NAND flash memory is used as an example of a semiconductor device, the semiconductor device may be a dynamic random access memory (DRAM), a ferroelectric random access memory (FRAM)®, a magnetoresistive random access memory (MRAM), a phase change random access memory (PCRAM), a logic circuit, a processor, or the like. In addition, with respect to direction-indicating terms "front" and "back" in FIG. 1, "front" is defined as a supporting substrate 1 side and "back" is defined as a mounting substrate 21 side in FIG. 1, and "front" and "back" in FIG. 1 do not necessarily coincide with "front" and "back" in FIG. 2 to FIG. 10.

In FIG. 1, a chip stacked body TA1 includes semiconductor chips P1 to P8 which are stacked upon each other. In this case, the thicknesses of the respective semiconductor chips P1 to P8 may be 40 μm or less. In order to prevent the chip stacked body TA1 from being destroyed during the handling of the chip stacked body TA1, the chip stacked body TA1 is fixed to the supporting substrate 1 by an adhesive layer 2. For example, a metal plate such as a lead frame may be used for the supporting substrate 1. The material of the supporting substrate 1 may be, for example Cu or alloy 42 (Fe—Ni based alloy). For the adhesive layer 2, insulating resin or a die attach film may be used.

Cell areas MA1, MA2 are provided in the respective semiconductor chips P1 to P8. NAND cells may be provided in an array shape or peripheral circuits such as a sense amplifier and a decoder are provided in the respective cell areas MA1, MA2. In this case, NAND cells are located in the respective cell areas MA1, MA2 in a regular arrangement of a cell pattern. Through electrodes 5 are provided extending through the respective semiconductor chips P2 to P8. The through electrode 5 is not provided in the semiconductor chip P1. The respective through electrodes 5 are insulated from the semiconductor chips P2 to P8 by side wall insulating films 4 which line the openings through which the through electrodes 5 extend. For example, Cu, Ni, Al, or the like may be used as the material of the through electrode 5. A barrier metal film of TiN or the like may be provided between the through electrode 5 and the side wall insulating film 4. In each of the semiconductor chips P2 to P8, one or more through electrodes 5 are located at a position that does not interfere with the regular arrangement of the cell pattern in each of the cell areas MA1, MA2. Therefore, the one or more through electrodes 5 are preferably not provided within each of the cell areas MA1, MA2, and are preferably provided in a region extending around or to the side of each of the cell regions MA1, MA2. Here, since the regularity of the arrangement of the cell pattern in each of the cell areas MA1, MA2 is maintained, it is possible to increase the resolution during photolithographic exposure for defining the cell areas, and to enhance the integration degree of the NAND cell. Further, in order to prevent connection failure of the through electrodes 5 in a location between the semiconductor chips P1 to P8 due to warping of the respective semiconductor chips P1 to P8, the through electrodes 5 may be provided between the respective cell regions MA1, MA2.

A back-surface electrode 6A is provided on the back surface side of the semiconductor chip P1. Back-surface electrodes 6B are provided on the back surface sides of the respective semiconductor chips P2 to P7. Back-surface electrodes 6C, 6D are provided on the back surface side of the semiconductor chip P8. Further, back-surface wirings 9C, 9D are provided on the back surface side of the semiconductor chip P8. The back-surface wiring 9D may be arranged at a position in which signals passing through the back-surface wiring 9D do not interfere with signals passing through the through electrode 5. A front surface electrode 7B is provided on the front surface side of the respective semiconductor chips P2 to P8.

In the respective semiconductor chips P2 to P7, the back-surface electrode 6B is connected to the back surface side of the through electrode 5. In the semiconductor chip P8, the back-surface wiring 9C is connected to the back surface side of the through electrode 5, and the back-surface electrode 6C is connected to the back-surface wiring 9C. Further, in the semiconductor chip P8, the back-surface electrode 6D is connected to the back-surface wiring 9D. The pad electrode 10 is provided in the end portion of the back-surface wiring 9D. In each of the semiconductor chips P2 to P8, the front surface electrode 7B is connected to the surface side of the through electrode 5. The back-surface electrode 6A of the semiconductor chip P1 is connected to the front surface electrode 7B of the semiconductor chip P2. In the semiconductor chips P2 to P8 stacked direction, the back-surface electrodes 6B of the semiconductor chips P2 to P8 that are adjacent in the stacked direction are connected to the front surface electrode 7B. An interface chip 3 is provided on the back surface side of the semiconductor chip P8. In addition, the interface chip 3 may perform data communication with the respective semiconductor chips P1 to P8. In this case, the interface chip 3 may transmit write data, commands, or addresses to the respective semiconductor chips P1 to P8 through the through electrode 5, or receive read data from the respective semiconductor chips P1 to P8. Instead of the interface chip 3, a controller chip may be provided that performs reading and writing control of the respective semiconductor chips P1 to P8. The front surface electrodes 7C, 7D are provided in the interface chip 3. The back-surface electrodes 6C, 6D of the semiconductor chip P8 are respectively connected to the front surface electrodes 7C, 7D of the interface chip 3. In addition, protruding electrodes such as solder bumps may be used for the back-surface electrodes 6A, 6B or the front surface electrode 7B, in order to ensure the spacing SP1 between the semiconductor chips P1 to P8. In this case, both the back-surface electrodes 6A, 6B and the front surface electrode 7B may be protruding electrodes, or may be a combination of the protruding electrode and a planar electrode. The back-surface electrode 6A, 6B and the front-surface electrode 7B may be formed of a single layer film formed of Au, Cu, Ni, Sn, Pg, Ag, or the like, or a stacked film thereof. When a solder material is used as the material of the back-surface electrodes 6A, 6B and the front-surface electrode 7B, a Sn—Cu alloy, an Sn—Ag alloy, or the like may be used. Cu may be used as the materials of the back-surface wirings 9C, 9D. For example, Ni or Ni—Pd alloy formed on Cu may be used as the material of the pad electrode 10. An Au film may be provided on the surface of Ni or Ni—Pd alloy of the pad electrode 10. The surface of Ni or Ni—Pd alloy of the pad electrode 10 may be subjected to Sn plating.

A spacer 8 for securing the spacing SP1 between adjacent ones of chips P1 to P8 in the stacked direction is provided in each gap between the respective semiconductor chips P1 to P8. The spacing SP1 between adjacent chips may be set to be within a range of about 10 to 20 μm. As the material of the spacer 8, insulating resin having an adhesion at a temperature less than a bonding temperature between the back-surface electrodes 6A, 6B, 6C, 6D and the front-surface electrodes 7B, 7C, 7D is used. For example, when the back-surface electrode 6A, 6B, 6C, 6D and the front-surface electrodes 7B, 7C, 7D are soldered together, an insulating resin having an adhesion at a temperature lower than a reflow temperature of solder may be used. For example, epoxy resin, polyimide resin, acrylic resin, phenol resin, benzocyclobutene resin, or the like may be as the material of the spacer 8. Here, the spacer 8 may establish and maintain the spacing SP1 between the through electrodes 5 in adjacent semiconductor chips P1 to P8. In this case, the spacer 8 may be arranged in the cell areas MA1, MA2. Thus, even when the through electrode 5 is located at a position other than the respective cell areas MA1, MA2, the spacing SP1 between the semiconductor chips P1 to P8 may be stably maintained.

The chip stacked body TA1 is flip-chip mounted on the mounting substrate 21 and supported by the protruding electrode 11. In this case, a spacing SP2 is provided between the chip stacked body TA1 and the mounting substrate 21. This spacing SP2 may be set to about 50 μm. The interface chip 3 may be located in the spacing SP2. A land electrode 22 and a printed wiring (not shown) are provided on the surface side of the mounting substrate 21, and a land electrode 24 and a printed wiring (not shown) are provided on the back surface side of the mounting substrate 21. The surrounding area of the land electrode 22 and the printed wiring are covered with the solder resist 23. The surrounding area of the land electrode 24 and the printed wiring are covered with the solder resist 25. The protruding electrode 11 is bonded to the pad electrode 10 and the land electrode 22. The protruding electrode 26 is bonded to the land electrodes 24. The protruding electrodes 11, 26 may be formed of a single layer film of Au, Cu, Ni, Sn, Pg, Ag, or the like, or may be a stacked film thereof. When using a solder material as the material of the protruding electrodes 11, 26, for example, a Sn—Cu alloy, a Sn—Ag alloy, and the like may be used. Cu and the like may be used as the material of the land electrodes 22, 24 and the printed wirings. An Au film may be formed on a portion exposed within the solder resists 23, 25 in the land electrodes 22, 24. For example, bismaleimide triazine (BT) resin and the like may be used as the base material of the mounting substrate 21.

The spacing SP1 between the semiconductor chips P1 to P8 is filled with sealing resin (for example, underfill resin 12A). The spacing SP2 between the chip stacked body TA1 and the mounting substrate 21 is filled with sealing resin (for example, underfill resin 12B). The supporting substrate 1, the chip stacked body TA1, and the interface chip 3 are sealed by sealing resin 12C on the mounting substrate 21. Molding resin may be used for the sealing resin 12C. For example, epoxy resin may be used for the underfill resin 12A, 12B and the sealing resin 12C.

Figure 2:
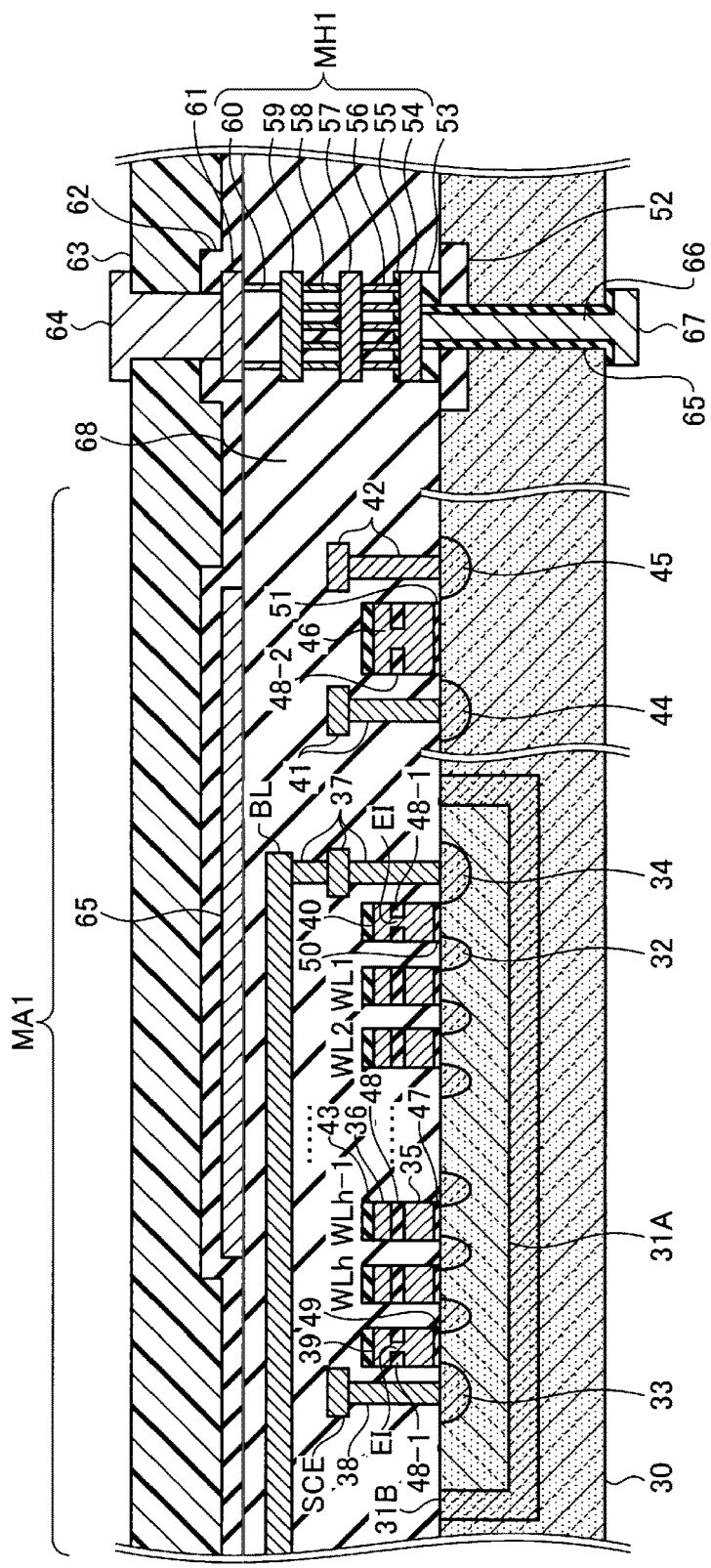
FIG. 2 is an enlarged sectional view illustrating a configuration example of a portion of E1 in FIG. 1.

FIG. 2 is a schematic diagram illustrating an enlarged portion of a configuration example of a portion of E1 in FIG. 1. In addition, direction-indicating terms "front" and "back" in FIG. 2 indicate directions opposite to "front" and "back" in FIG. 1. In other words, the front-surface electrode 64 in FIG. 2 corresponds to the back-surface electrode 6B, and the back-surface electrode 67 corresponds to the front-surface electrode 7A.

In FIG. 2, a semiconductor substrate (semiconductor layer) 30 is provided in the semiconductor chip P1 (FIG. 1). A buried well 31B is formed on the semiconductor substrate 30. A cell well 31A is formed in the buried well 31B, and a memory cell array is formed in the cell well 31A. The material of the semiconductor substrate 30, may be, for example, Si, Ge, SiGe, GaAs, AlGaAs, InP, GaP, InGaAs, GaN, or SiC. Further, a device isolation layer 52 is formed in the semiconductor substrate 30. In addition, for the device isolation layer 52, for example, it is possible to use a shallow trench isolation (STI) structure.

In the cell area MA1, charge storage layers 35 are formed over a tunnel insulating film 47 formed on the cell well 31A. Further, an intermediate insulating film 48 is formed over the charge storage layer 35 and a control gate electrode 36 is located thereover. Select gate electrodes 39 and 40 are respectively located on gate insulating films 49 and 50. The select gate electrodes 39 and 40 are formed on both sides of the charge storage layer 35. One memory cell is configured by one charge storage layer 35 and the control gate electrode 36 thereon. An intermediate insulating film 48-1 having an opening EI therethrough is provided in the select gate electrodes 39 and 40. In other words, it may be said that the select gate electrodes 39 and 40 are divided into an upper electrode and a lower electrode in the intermediate insulating film 48-1, and the upper electrode and the lower electrode are electrically connected through the opening EI.

In the cell well 31A, a doped diffusion layer 32 is arranged between the charge storage layers 35 or between the charge storage layer 35 and the select gate electrodes 39 and 40, and doped diffusion layers 33 and 34 are respectively arranged on one side of the select gate electrodes 39 and 40. The doped diffusion layer 34 is connected to the bit line BL through a contact electrode 37, and the doped diffusion layer 33 is connected to a source line SCE through the contact electrode 38. In addition, in a planar NAND memory, the control gate electrode 36 of each memory cell may configure word lines WL1 to WLh (h is a positive integer).

Further, a gate electrode 46 is formed on the semiconductor substrate 30 over a gate insulating film 51. An intermediate insulating film 48-2 having an opening EI is arranged in the gate electrode 46. In other words, the gate electrode 46 is divided into an upper electrode and a lower electrode with respect to the intermediate insulating film 48-2, and the upper electrode and the lower electrode are electrically connected by the opening EI. A cap insulating film 43 is provided on the control gate electrode 36, the select gate electrodes 39, 40 and the gate electrode 46. The cap insulating film 43 may also be used as a hard mask when forming the control gate electrode 36, the select gate electrodes 39, 40 and the gate electrode 46. For example, SiN and the like may be used for the cap insulating film 43. In the semiconductor substrate 30, doped diffusion layers 44, 45 are formed to sandwich a channel region under the gate electrode 46 therebetween. The doped diffusion layers 44, 45 are respectively connected to contact electrodes 41, 42. In addition, for example, the cell well 31A may be formed as a P-type semiconductor, and the buried well 31B and the doped diffusion layers 32, 33, 34, 44, 45 are formed as the N-type. For example, polycrystalline silicon may be used for material of the charge storage layer 35. For example, tungsten may be used for the material of the control gate electrode 36, the select gate electrodes 39 and 40 and the gate electrode 46. For example, $SiO_2$ may be used for the material of the tunnel insulating film 47 and the gate insulating films 49, 50, 51. An interlayer insulating film 68 is formed on the semiconductor substrate 30. The power supply line 65 is formed on the interlayer insulating film 68. An inorganic protective layer 62 is formed on the power line 65, and an organic protective layer 63 is formed on the inorganic protective layer 62. For example, SiN, $SiO_2$, or a stacked film thereof may be used as the materials of the interlayer insulating film 68 and the inorganic protective layer 62. For example, a polyimide resin film and a phenol-based resin layer may be used as the material of the organic protective layer 63.

The intermediate insulating film 53 is formed on the device isolation layer 52, and a multilayer wiring MH1 is formed on the intermediate insulating film 53. A bottom layer connection wiring 54, a lower layer connection wiring 57, an upper layer connection wiring 59, and a top connection line 61 are provided in the multilayer wiring MH1. The top layer connection wiring 61 may be thicker than the lower layer connection wiring 57 and the upper layer connection wiring 59. For example, the thickness of the top layer connection wiring 61 is 500 nm or more, the thickness of the lower layer connection wiring 57 and the upper layer connection wiring 59 may be set at 100 nm or less. A cap insulating film 55 is provided on the bottom layer connection wiring 54. The bottom layer connection wiring 54 and the lower layer connection wiring 57 are connected by a via 56. The lower layer connection wiring 57 and the upper layer connection wiring 59 are connected by a via 58. The upper layer connection wiring 59 and the top layer connection wiring 61 are connected by a via 60. The via 60 may be arranged at a position to avoid a position immediately above the through electrode 66 (provided in a position other than the position immediately above).

The intermediate insulating films 48, 48-1, 48-2, 53 may be made of the same material. For example, a five-layer structure of NONON (N is SiN, O is $SiO_2$) may be used for the intermediate insulating films 48, 48-1, 48-2, 53. The intermediate insulating films 48, 48-1, 48-2, 53 may be formed by the same film forming process and etching process. The intermediate insulating film 53 may be omitted.

The bottom layer connection wiring 54 may be made of the same material as the gate electrode 46. The bottom layer connection wiring 54 and the gate electrode 46 may belong to the bottom layer wiring of the multilayer wiring MH1. The gate electrode 46 and the bottom layer connection wiring 54 may be formed by the same film forming process and etching process.

The lower layer connection wiring 57 may be made of the same material as the source line SCE. The lower layer connection wiring 57 and the source line SCE may be a part of the lower layer wiring of the multilayer wiring MH1. The lower layer connection wiring 57 and the source line SCE may be formed by the same film forming process and a CMP process. The lower layer connection wiring 57 and the via 56 may be collectively formed by a dual damascene process. High melting point metal such as W may be used for the lower layer connection wiring 57, the via 56, and the source line SCE. There may be a barrier metal film such as Ti or TiN as a base layer of the lower layer connection wiring 57, the via 56, and the source line SCE. The upper layer connection wiring 59 may be made of the same material as the bit line BL. The upper layer connection wiring 59 and the bit line BL may be part of the upper wiring of the multilayer wiring MH1. The upper layer connection wiring 59 and the bit line BL may be formed by the same film forming process and a CMP process. The upper layer connection wiring 59 and the via 58 may be collectively formed by a dual damascene process. A medium melting point metal such as Cu may be used for the upper layer connection wiring 59, the via 58, and the bit line BL. There may be a barrier metal film such as Ti or TiN as a base layer of the upper layer connection wiring 59, the via 58, and the bit line BL.

The top layer connection wiring 61 may be made of the same material as the power supply line 65. The top layer connection wiring 61 and the power supply line 65 may be part of the top layer wiring of the multilayer wiring MH1. The top layer connection wiring 61 and the power supply line 65 may be formed by the same film forming process and etching process. Low melting-point metal such as Al may be used for the top layer connection wiring 61, the via 60, and the power supply line 65. In this case, metal having lower rigidity than the upper layer connection wiring 59 and the lower layer connection wiring 57 may be used for the top layer connection wiring 61. The bottom layer connection wiring 54, the lower layer connection wiring 57, the upper layer connection wiring 59 and the vias 56, 58 and 60 are embedded in the interlayer insulating film 68. The top layer connection wiring 61 is located on the interlayer insulating film 68. The surrounding area of the top layer connection wiring 61 is covered with the inorganic protective layer 62, and the front-surface electrode 64 is formed as a back-surface electrode 6B of FIG. 1 on the top layer connection wiring 61.

A through electrode 66 is provided as the through electrode 5 illustrated in FIG. 1, in the semiconductor substrate 30. The through electrode 66 is insulated from the semiconductor substrate 30 by the side wall insulating films 65. The surface side of the through electrode 66 is in contact with the bottom layer connection wiring 54. A back-surface electrode 67 is provided as the front-surface electrode 7A in FIG. 1, on the back surface side of the through electrode 66.

Here, since the through electrode 66 is in direct contact with the bottom layer connection wiring 54, it becomes possible to provide a wiring on the through electrode 66. Therefore, as compared with the configuration in which the through electrode 66 is connected to the top layer connection wiring 61, it becomes possible to increase the degree of freedom of the wiring layout of the multilayer wiring MH1. Further, the wiring for the bottom layer connection wiring 54 is formed by etching a metal layer to form the bottom layer connection wiring 54, and a damascene process, including chemical mechanical polishing, is used to form the lower layer connection wiring 57 and the upper layer connection wiring 59. Thus, it is possible to improve the flatness of the surface opposite from the bonding surface of the through electrode 66, by contacting the through electrode 66 and the bottom layer connection wiring 54, as compared to the configuration in which the through electrode 66 is bonded to the lower layer connection wiring 57 or the upper layer connection wiring 59. Therefore, it is possible to reduce the risk of the through electrodes 66 penetrating the bottom layer connection wiring 54, and to reduce the high resistance defect.

Further, it is possible to improve the flexibility of the top layer connection wiring 61, by disposing the via 60 at a position other than a position immediately above the through electrode 66, i.e., to horizontally offset the position of the via 60 with respect to the underlying through electrode 66. Therefore, since it is possible to impart cushioning properties to the top layer connection wiring 61, and to disperse the stress occurring when a load is applied to the through electrode 66 through the front-surface electrode 64 or the back-surface electrode 67, destruction of the bottom layer connection wiring 54, the lower layer connection wiring 57, or the upper layer connection wiring 59 is suppressed.

Figure 3A:
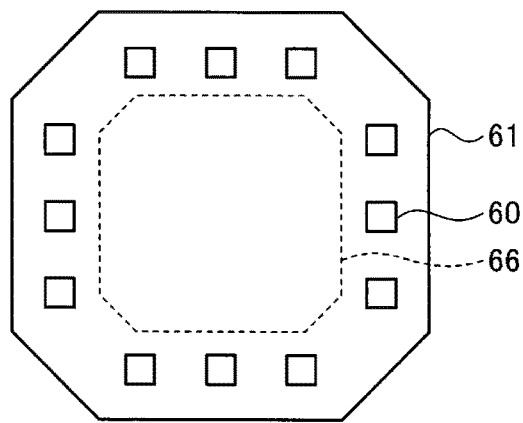
FIG. 3A is a plan view illustrating an arrangement example of a via 60 in FIG. 2.
Figure 3B:
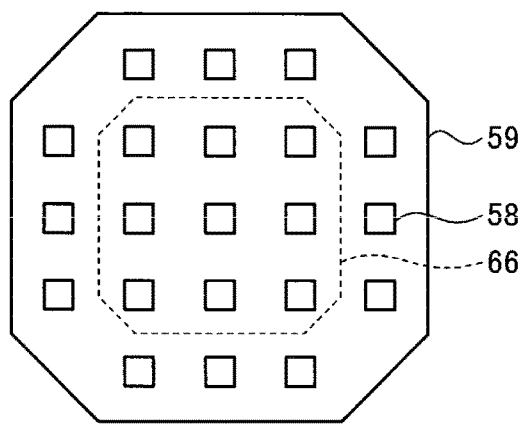
FIG. 3B is a plan view illustrating an arrangement example of a via 58 in FIG. 2.
Figure 3C:
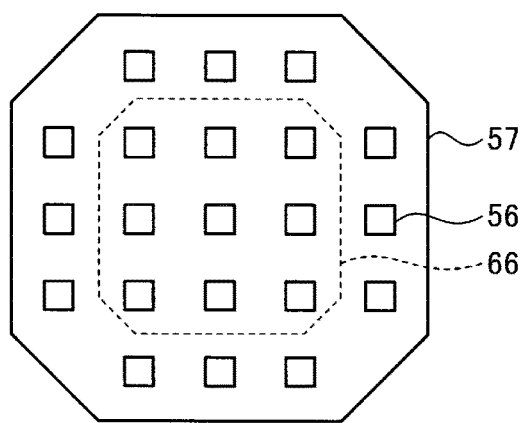
FIG. 3C is a plan view illustrating an arrangement example of a via 56 in FIG. 2.

FIG. 3A is a plan view illustrating an arrangement example of the via 60 in FIG. 2, FIG. 3B is a plan view illustrating an arrangement example of the via 58 in FIG. 2, and FIG. 3C is a plan view illustrating an arrangement example of the via 56 in FIG. 2.

In FIG. 3A, under the top layer connection wirings 61, the vias 60 are arranged around the through electrode 66, and the via 60 is not arranged directly above the through electrode 66. Thus, it is possible to improve the flexibility of the top layer connection wiring 61, and to disperse the stress when a load is applied to the front-surface electrode 64 or the through electrode 66.

In FIG. 3B, the vias 58 may be arranged at equal intervals under the upper layer connection wiring 59. In this case, in order to reduce the load applied to the via 58, it is possible to dispose the vias 58 directly above the through electrode 66 as well as around the upper layer connection wiring 59. In FIG. 3C, the vias 56 may be arranged at equal intervals under the lower layer connection wiring 57. In this case, in order to reduce the load applied to the via 56, it is possible to dispose the via 56 directly above the through electrode 66, as well as around the through electrode 66. In the above embodiment, four-layer wiring (the bottom layer wiring, the lower layer wiring, the upper wiring and the top layer wiring) is used as an example of a multilayer wiring MH1 that is connected to the through electrode 66 formed on a semiconductor substrate 30, the number of layers is not important as long as two or more layers of wirings are provided. In this case, the bottom layer wiring may be used as the gate electrode for controlling the conductivity of the channel region formed in the semiconductor substrate 30 in the active region thereof.

Figure 4:
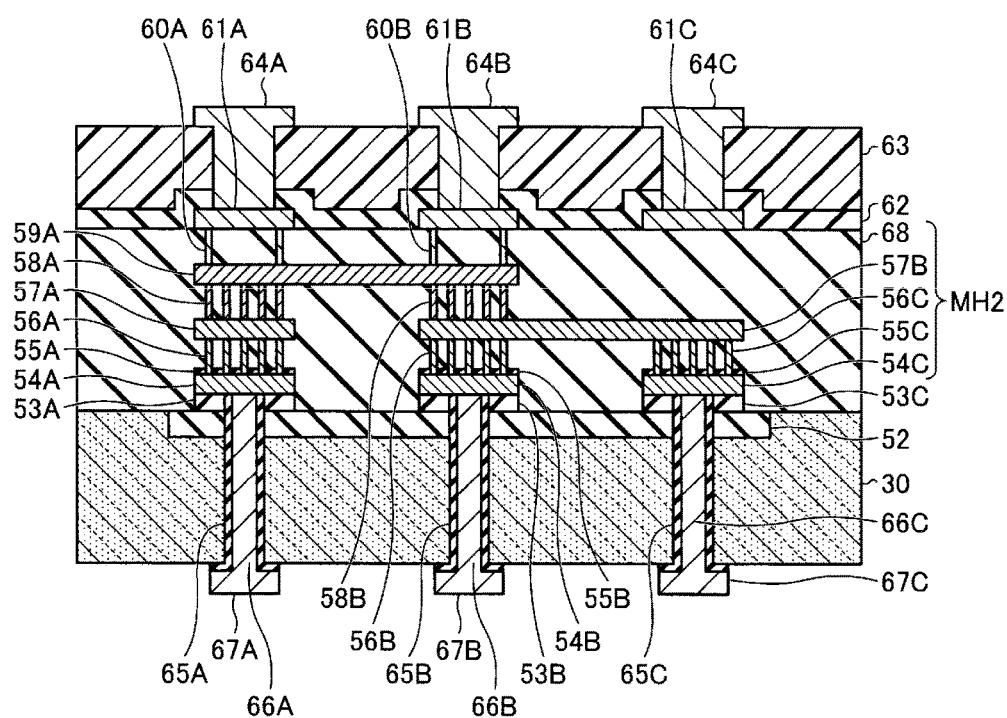
FIG. 4 is a sectional view illustrating an example of a wiring layout applicable to the semiconductor device in FIG. 1.

FIG. 4 is a sectional view illustrating an example of a wiring layout applicable to the semiconductor device in FIG. 1. In FIG. 4, a configuration in which three through electrodes 66A to 66C are arranged is illustrated as an example.

In FIG. 4, a device isolation layer 52 is formed extending inwardly of the semiconductor substrate 30. Intermediate insulating films 53A to 53C are formed on the device isolation layer 52, and the multilayer interconnection MH2 is formed on the intermediate insulating films 53A to 53C. The bottom layer connection wirings 54A to 54C, the lower layer connection wirings 57A, 57B, the upper layer connection wiring 59A, and the top layer connection wirings 61A to 61C are provided as the multilayer wiring MH2. The cap insulating films 55A to 55C are respectively provided on the bottom layer connection wirings 54A to 54C. The bottom layer connection wiring 54A to 54C are respectively arranged on the intermediate insulating films 53A to 53C. The lower layer connection wiring 57A is arranged on the bottom layer connection wiring 54A. The lower layer connection wiring 57B is arranged on the bottom layer connection wirings 54B, 54C. The upper layer connection wiring 59A is arranged on the lower layer connection wiring 57A, 57B. The top layer connection wirings 61A, 61B are arranged on the upper layer connection wiring 59A. The top layer connection wiring 61C is arranged on the lower layer connection wiring 57B.

The bottom layer connection wiring 54A and the lower layer connection wiring 57A are connected through vias 56A. The bottom layer connection wiring 54B and the lower layer connection wiring 57B are connected through vias 56B, and the bottom layer connection wiring 54C and the lower layer connection wiring 57B are connected through vias 56C. The lower layer connection wiring 57A and the upper layer connection wiring 59A are connected through vias 58A, and the lower layer connection wirings 57B and the upper layer connection wiring 59A are connected through vias 58B. The upper layer connection wiring 59A and the top layer connection wiring 61A are connected through vias 60A, and the upper layer connection wiring 59A and the top layer connection wiring 61B are connected through vias 60B. The vias 60A may be arranged at a position other than a position immediately above the through electrode 66A, the vias 60B may be arranged at a position other than a position immediately above the through electrode 66B.

The bottom layer connection wirings 54A to 54C, the lower layer connection wirings 57A, 57B, the upper layer connection wiring 59A and the top layer connection wirings 61A to 61C and the vias 56A to 56C, 58A, 58B, 60A, 60B are embedded in the interlayer insulating film 68. The top layer connection wirings 61A to 61C are located on the interlayer insulating film 68. The area surrounding the top layer connection wirings 61A to 61C is covered with the inorganic protective layer 62, and the front-surface electrodes 64A to 64C are respectively formed on the top layer connection wirings 61A to 61C. The through electrodes 66A to 66C extend through the semiconductor substrate 30. The through electrodes 66A to 66C are insulated from the semiconductor substrate 30 side wall insulating films 65A to 65C, respectively. The upper ends of the through electrodes 66A to 66C are in contact with the bottom layer connection wirings 54A to 54C, respectively. Back-surface electrodes 67A to 67C are respectively provided on the back surface side of the through electrodes 66A to 66C.

Here, since the through electrodes 66A to 66C are in direct contact with the bottom layer connection wirings 54A to 54C, respectively, it is possible to provide the lower layer connection wiring 57A and the upper layer connection wiring 59A directly above the through electrodes 66A, to provide the lower layer connection wiring 57B and the upper layer connection wiring 59B directly above the through electrode 66B, or a lower layer connection wiring 57B directly above the through electrode 66C. Accordingly, it is possible to electrically connect the through electrodes 66A, 66B through the upper layer connection wiring 59A, or to electrically connect the through electrodes 66B, 66C through the lower layer connection wiring 57B, thereby improving the degree of freedom of the wiring layout of the multilayer wiring MH1.

Second Embodiment

Figure 5:
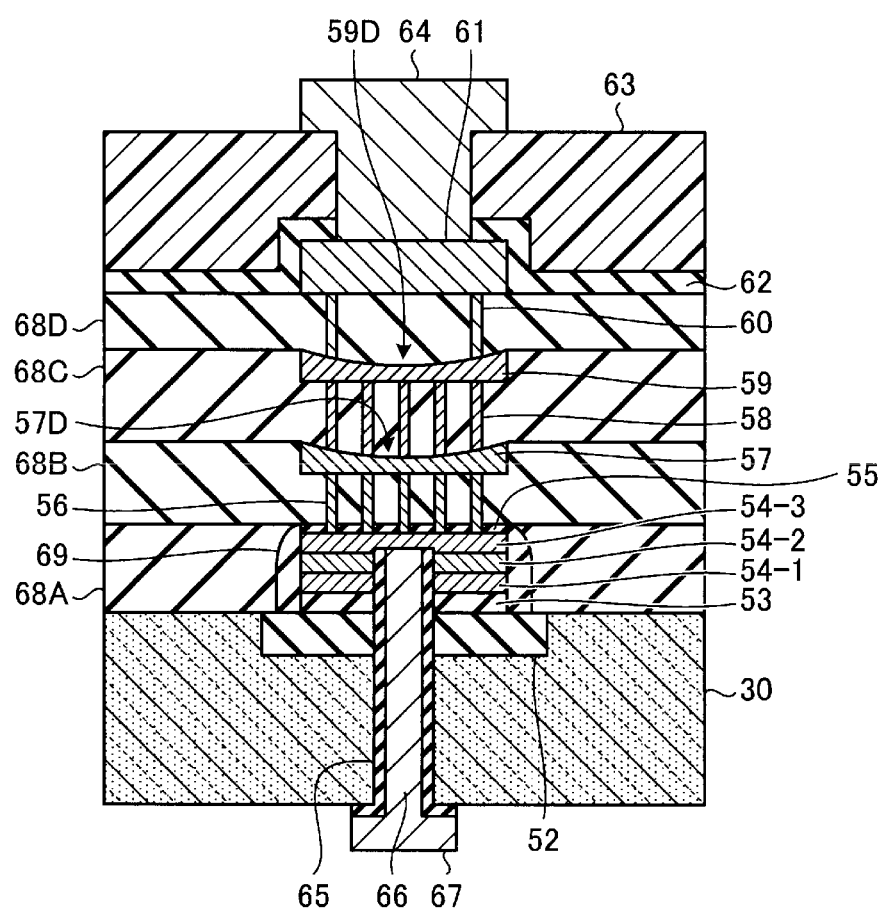
FIG. 5 is a sectional view illustrating a connection structure of through electrodes applicable to a semiconductor device according to a second embodiment.

FIG. 5 is a sectional view illustrating a connection structure of through electrodes applied to a semiconductor device according to a second embodiment.

In the structure of FIG. 5, a stacked structure of a first conductive layer 54-1, a second conductive layer 54-2, and a third conductive layer 54-3 is used for the bottom layer connection wiring 54 of FIG. 2. Polycrystalline silicon may be used for the first conductive layer 54-1, WN (Tungsten Nitride) may be used for the second conductive layer 54-2, and one of W (Tungsten) Al (aluminum), Cu (Copper), NiSi (Nickel Silicide), CoSi (Cobalt silicide) and Mn (Manganese) may be used for the third conductive layer 54-3. A sidewall spacer 69 is formed on the side walls of the first conductive layer 54-1, the second conductive layer 54-2 and the third conductive layer 54-3. For example, $SiO_2$ may be used for the material of the sidewall spacers 69. Then, the through electrode 66 is formed to contact the third conductive layer 54-3. In this case, the through electrodes 66 are configured to extend inwardly of the stack of first to third conductive layers 54-1, 54-2 and 54-3, so that the through electrodes 66 may be in direct contact with the conductive layer having the lowest resistance as among the first conductive layer 54-1, the second conductive layer 54-2, and the third conductive layer 54-3.

Further, interlayer insulating films 68A to 68D are provided as the interlayer insulating film 68. The first conductive layer 54-1, the second conductive layer 54-2 and the third conductive layer 54-3 are surrounded by the sidewall spacer 69 and embedded in the interlayer insulating film 68A. It is possible to prevent dishing from occurring in the first conductive layer 54-1, the second conductive layer 54-2 and the third the conductive layer 54-3, by pattern etching the first conductive layer 54-1, the second conductive layer 54-2 and the third conductive layer 54-3 from blanket films of the material from which the first conductive layer 54-1, the second conductive layer 54-2 and the third conductive layer 54-3 are to be formed.

The vias 56 and the lower layer connection wiring 57 are embedded in the interlayer insulating film 68B. In this case, dishing 57D is generated in the lower layer connection wiring 57 by forming the vias 56 and the lower layer connection wiring 57 using a the dual damascene process.

The vias 58 and the upper layer connection wiring 59 are embedded in the interlayer insulating film 68C. In this case, dishing 59D is generated in the upper layer connection wiring 59 when forming the vias 58 and the upper layer connection wiring 59 using the dual damascene process.

The vias 60 are embedded in the interlayer insulating film 68D, and the top layer connection wiring 61 is arranged on the interlayer insulating film 68D and contacts the upper end of the vias 60.

Here, since the through electrode 66 is in direct contact with the third conductive layer 54-3, it becomes possible to reduce the contact resistance, as compared with the case of the through electrode 66 being in contact with the first conductive layer 54-1 or the second conductive layer 54-2. Further, it becomes possible to prevent defective electrical connections due to dishing 57D, 59D by directly connecting the through electrode 66 to the third conductive layer 54-3, as compared with the configuration in which the through electrode 66 is connected to the lower layer connection wiring 57 or the upper layer connection wiring 59. In addition, in the embodiment of FIG. 5, a case is illustrated in which the bottom layer connection wiring 54 in FIG. 2 has a three-layer structure, but the bottom layer connection wiring 54 may have any number of layers, without being limited to a three-layered structure.

Third Embodiment

FIG. 6A, FIG. 6B, FIG. 7A, and FIG. 7B are sectional views illustrating the intermediate results of a manufacturing method of a semiconductor device according to a third embodiment.

Figure 6A:
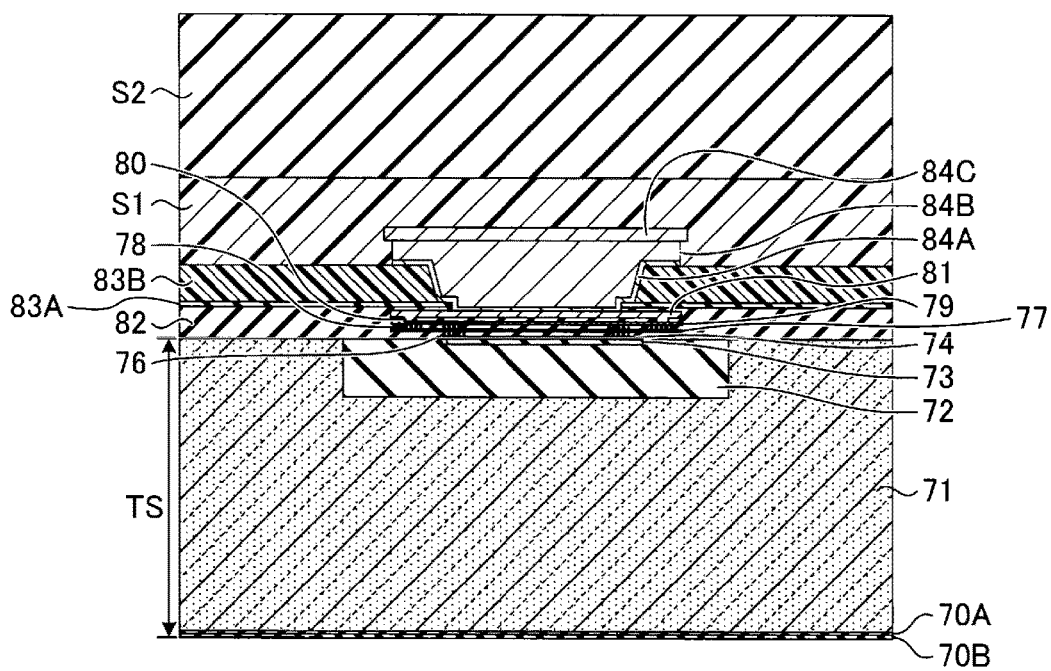
FIG. 6A and FIG. 6B are sectional views illustrating a manufacturing method of a semiconductor device according to a third embodiment.

As shown in FIG. 6A, a device isolation layer 72 is formed in a semiconductor substrate 71. Next, an intermediate insulating film 73 and the bottom layer connection wiring 74 are formed on the device isolation layer 72 by sequentially depositing an intermediate insulating material and a bottom layer conductive material on the device isolation layer 72 by a method such as CVD or sputtering, and patterning the intermediate insulating material and the bottom layer conductive material by a photolithography technique and an reactive ion etch (RIE) technique. Then, after forming an interlayer insulating film 82 on the bottom layer connection wiring 74 by a method such as CVD, a lower layer connection wiring 77, connected to the bottom layer connection wiring 74, is formed on a via 76 in an opening etched through the interlayer insulating film. Then, an upper layer connection wiring 79 connected to the lower layer connection wiring 77 through the via 78 by the dual damascene is embedded in the interlayer insulating film 82. Then, a via 80 connected to the upper layer connection wiring 79 is embedded in the interlayer insulating film 82. The connection wiring layers are then polished so they are present only in the opening in the interlayer insulating film. Then, a top layer connection wiring 81 connected to the upper layer connection wiring 79 through the via 80 is formed on the interlayer insulating film 82. The material layers for forming the connection wirings and vias are then polished so they are present only in the opening in the interlayer insulating film. Then, an inorganic protective film 83A, patterned such that the surface of the top layer connection wiring 81 is exposed, is formed on the interlayer insulating film 82. Then, an organic protective film 83B patterned such that the surface of the top layer connection wiring 81 is exposed is formed on the inorganic protective film 83A. Then, a barrier metal film 84A and a bump electrode 84B are formed on the top layer connection wiring 81, and a metal coating film 84C is formed on the bump electrode 84B. For example, a two-layer structure made of Cu which is stacked on a Ti layer may be used for the material of the barrier metal film 84A. For example, Ni may be used for the material of the bump electrode 84B. A metallized film 84C is able to improve the wettability of solder in a bump electrode 84B, and for example, Au may be used. Then, the surface side of the semiconductor substrate 71 is adhered to the supporting substrate S2 by an adhesive layer S1. In this case, the semiconductor substrate 71 may still be in a wafer state, i.e., not yet singulated into individual devices. In addition, the material of the supporting substrate S2 may be Si, or may be glass. Thermosetting resin may be used as the material of the adhesive layers S1. Then, the semiconductor substrate 71 is thinned by polishing the back surface side of the semiconductor substrate 71 by a method such as CMP or BSG. In this case, the thickness TS of the semiconductor substrate 71 may resultantly be 50 μm or less. Then, insulating films 70A, 70B are sequentially formed on the back surface of the semiconductor substrate 71 by a method such as CVD. $SiO_2$ may be used as the material of the insulating film 70A, and SiN may be used as the material of the insulating layer 70B.

Figure 6B:
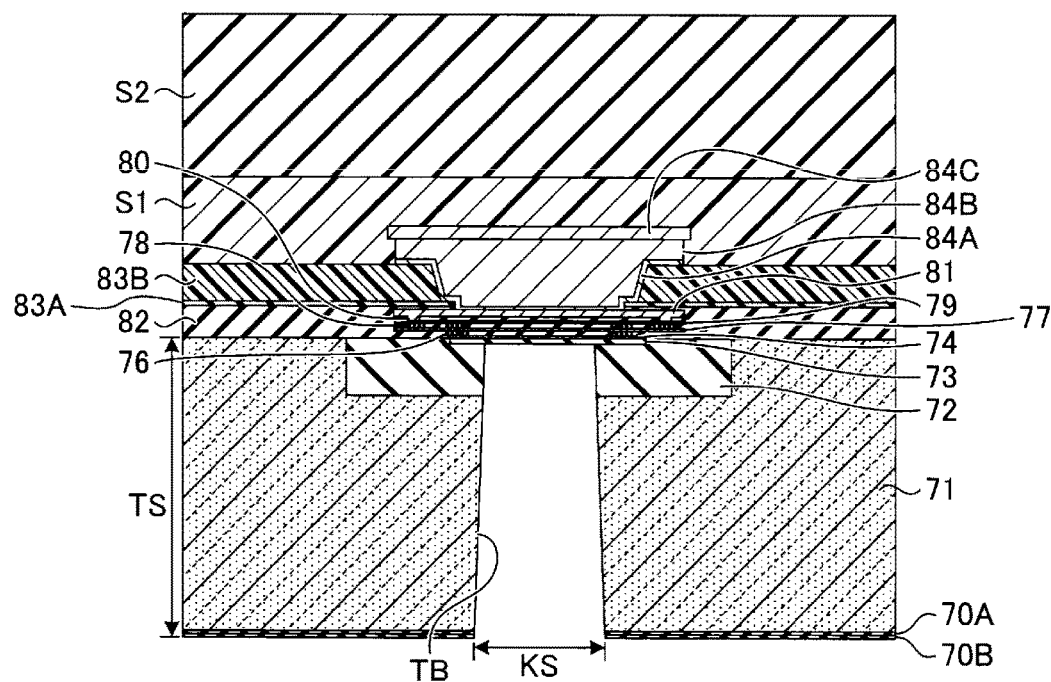
Figure 7A:
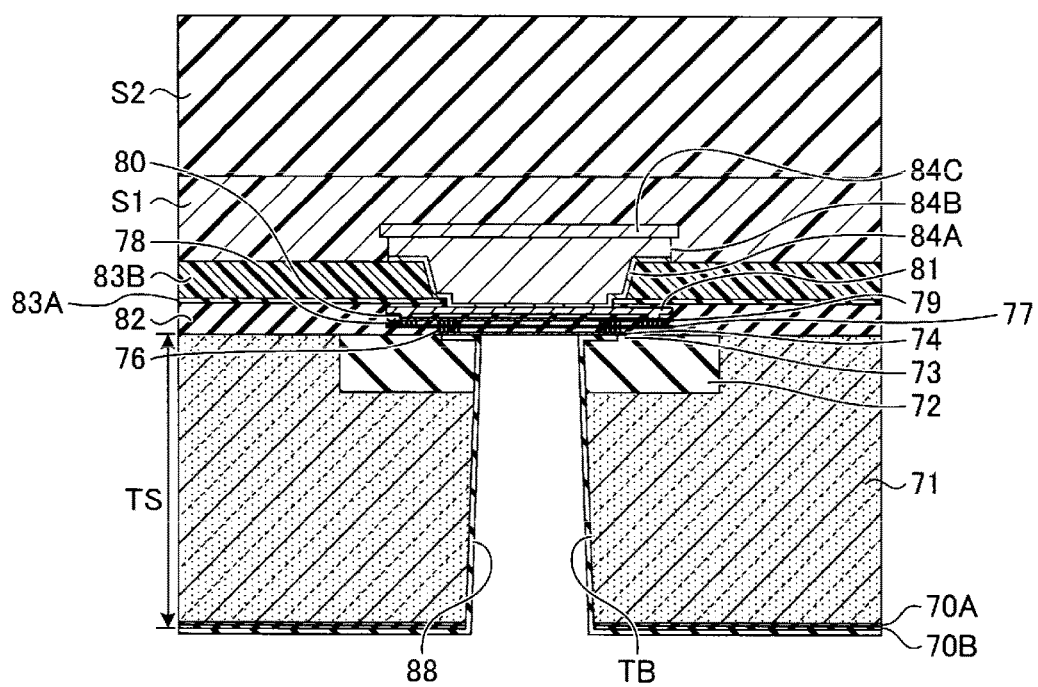
FIG. 7A and FIG. 7B are sectional views illustrating the manufacturing method of the semiconductor device according to the third embodiment.

Next, as shown in FIG. 6B, a through hole TB is formed through the semiconductor substrate 71 and device isolation layer 72 by a photolithography technique and an RIE technique. In this case, the base of the through hole TB is stopped on or in the intermediate insulating film 73. The largest diameter KS of the through hole TB may be set as about 10 μm. Next, as shown in FIG. 7A, a sidewall insulating film 88 is formed on the side wall of the through hole TB and over the insulating layer 70B by a method such as CVD. Then, the bottom layer connection wiring 74 is exposed to the through hole TB by etching the sidewall insulating film 88 and the intermediate insulating film 73 at the base of the through hole TB.

Figure 7B:
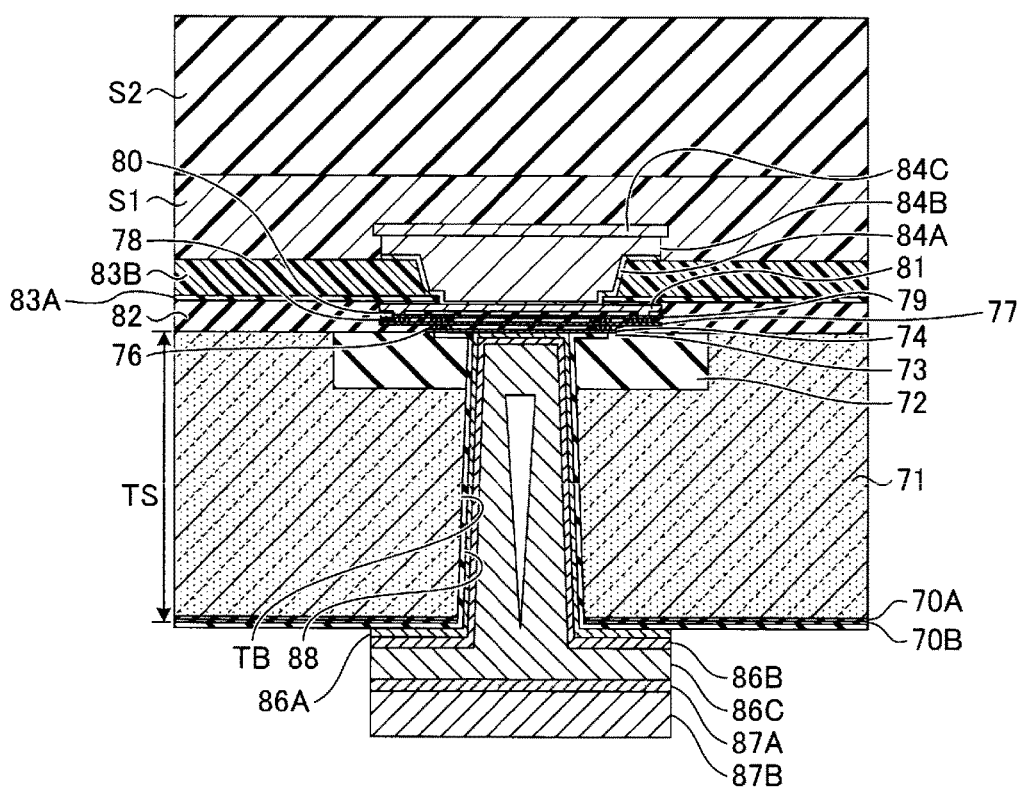

Next, as illustrated in FIG. 7B, a barrier metal film 86A and a seed layer 86B are sequentially formed such that the side wall of the through hole TB is covered, using a method such as sputtering. Ti may be used as the material of the barrier metal film 86A, and Cu may be used as the material of the seed layer 86B. Then, a through electrode 86C is embedded in the through hole TB by a method such as an electrolytic plating. Ni may be used as the material of the through electrode 86C. Then, after forming a base metal film 87A on the surface of the through electrode 86C, a bump electrode 87B is formed on the base metal film 87A. Cu may be used as the material of the base metal film 87A, and Sn may be used as the material of the bump electrode 87B. Then, a probe pin of a testing apparatus (not shown) is brought into contact with the bump electrode 87B in a state where the semiconductor substrate 71 is supported by the supporting substrate S2, such that a device test of the semiconductor substrate 71 is performed. Thereafter, after a supporting tape such as a dicing tape is adhered on the back surface side of the semiconductor substrate 71, the adhesive layer S1 and the supporting substrate S2 are peeled from the semiconductor substrate 71. Then, the semiconductor substrate 71 is singulated into individual semiconductor chips P1 to P8 (FIG. 1) by dicing the semiconductor substrate 71. Then, when the semiconductor chips P1 to P8 are stacked, as shown in FIG. 1, the bump electrodes 87B of the semiconductor chip of the upper layer (e.g., P8) are connected to the bump electrodes 84B of the semiconductor chip of the lower layer (e.g., P1. Here, when Ni is used for the bump electrode 84B, and Sn is used for the bump electrode 87B, a Ni—Sn alloy is formed during the connecting of the bump electrodes 84B, 87B such as by heating the substrate to the melting or reflow temperature of tin (Sn).

Fourth Embodiment

Portion (a) of FIG. 8 is a plan view illustrating a layout example of a front-surface test pad of a semiconductor device according to a fourth embodiment, portion (b) of FIG. 8 is an enlarged plan view illustrating a front-surface electrode of the semiconductor device according to the fourth embodiment, portion (c) of FIG. 8 is an enlarged plan view illustrating a front-surface test pad of the semiconductor device according to the fourth embodiment, and portion (d) of FIG. 8 is a plan view illustrating a layout example of a back-surface test pad of the semiconductor device according to the fourth embodiment. In portions (a) to (d) of FIG. 8, a front-surface electrode 91 and a front-surface test pad 93 are provided on the front surface of the semiconductor chip P11. It is possible to dispose about a few tens of thousands of front-surface electrodes 91 and front surface test pads 93 on each of the semiconductor chips P11. Back-surface electrodes 95 and back-surface test pads 96 are provided on the back surface of the semiconductor chip P11 (FIG. 8D).

Even when a load is applied to the back-surface test pads 96 during testing, and the back-surface test pads 96 are compressed and resultantly expand laterally, the distance between the back-surface test pads 96 is set such that adjacent back-surface test pads do not contact each other when they are compressed. Through electrodes 92 and 94 are embedded in and extend through the semiconductor chip P11.

Here, one front-surface electrode 91 and one back-surface electrode 95 are connected together by one through electrode 92. One front-surface test pad 93 is connected to three through electrodes 94, and one back-surface test pad 96 is connected to the one through electrode 94. Three through electrodes 94 which are connected to one front-surface test pad 93 may be arranged on the apices of a virtual triangle. Here, the virtual triangle is a virtual figure for convenience indicating a positional relationship between the through electrodes 94, and whether or not the configuration has the shape of a triangle does not matter. The size of the front-surface test pads 93 may be larger than the size of the front-surface electrodes 91. The lengths X2, Y2 of the sides of the front-surface test pads 93 may be about 80 μm, and lengths X1, Y1 of the sides of the front-surface electrode 91 may be about 40 μm. The lengths X2, Y2 of the sides of the front-surface test pads 93 may be smaller than the diameter R3 of the tip of a test probe pin. In this case, the diameter R3 of the tip of the probe pin 121 (FIG. 10B) may be about 120 to 130 μm. It is preferable not to locate electrodes and spacers 8 other than on the front-surface test pad 93 within the movable range of the probe pin 121. The diameters R1, R2 of the respective through electrodes 92, 94 may be equal to each other, and may be 20 μmφ or less.

FIG. 9 is a sectional view illustrating an example of a connection structure of the front-surface test pad in portion (c) of FIG. 8 with the through electrodes. In addition, in FIG. 9, for easy understanding, three through electrodes 94 which are conveniently connected to one front-surface test pad 93 are illustrated side by side in one section.

In FIG. 9, the semiconductor substrate 101 is the base for the semiconductor chip P11. A device isolation layer 102 is formed in the semiconductor substrate 101. An intermediate insulating film 103 is formed on the device isolation layer 102, and a multilayer wiring MH3 is formed on the intermediate insulating film 103. The bottom layer connection wiring 104, the lower layer connection wiring 107, the upper layer connection wiring 109 and the top layer connection wiring 93 are provided in the multilayer wiring MH3. A stacked structure of a first conductive layer 104-1, a second conductive layer 104-2 and a third conductive layer 104-3 is used for the bottom layer connection wiring 104. The multi-layer wiring MH3 may be configured similarly to the configuration of FIG. 5. A cap insulating film 105 is provided on the bottom layer connection wiring 104. A sidewall spacer 119 is formed on the sidewalls of the first conductive layer 104-1, the second conductive layer 104-2, and the third conductive layer 104-3. The bottom layer connection wiring 104 and the lower layer connection wiring 107 are connected by a via 106. The lower layer connection wiring 107 and the upper layer connection wiring 109 are connected by a via 108. The upper layer connection wiring 109 and the top layer connection wiring 93 are connected by a via 110. The via 110 may be located at a position other than a position immediately above a through electrode 94. Further, an interlayer insulating film 118 is formed on the semiconductor substrate 101. An inorganic protective layer 112 is formed on the interlayer insulating film 118. The surrounding area of the top layer connection wiring 93 is covered with the inorganic protective film 112, and an organic protective layer 113 is formed on the top layer connection wiring 93 and the inorganic protective layer 112. The through electrode 94 is provided on the semiconductor substrate 101. The through electrode 94 is insulated from the semiconductor substrate 101 by the side wall insulating film 105. The inner ends of the three through electrodes 94 are in contact with one third conductive layer 104-3. One back-surface electrode 96 is provided on the back surface of the through electrodes 94 where the through electrodes 94 extend outwardly of the substrate 101.

FIG. 10A is a plan view illustrating a method of arranging of probe cards during a test of the semiconductor device according to the fourth embodiment, and FIG. 10B is an enlarged sectional view illustrating a contact state of a probe pin in FIG. 10A.

In FIG. 10A, probe pins 121 are provided in the probe card 120. For example, a pogo pin (spring pin) may be used as the probe pin 121. For example, ceramics and the like may be used as the materials of the probe card 120. In this case, the probe pins 121 are housed in the holder 122, and are supported by a spring 123 so as to lift the probe pin 121. Probe pins 121 equal in number to the number of front-surface test pads 93 may be provided. The arrangement of the probe pins 121 preferably corresponds to the arrangement of the front-surface test pad 93. The probe card 120 is electrically connected to the tester 124.

It is possible to test the semiconductor chips P11 by pressing the probe pin 121 to simultaneously contact three back-surface test pads 96 connected to one front-surface test pad 93. The test time of the semiconductor chip P11 is reduced by simultaneously pressing a plurality of probe pins 121 onto a few thousand of the back-surface test pads. It is possible to increase the production yield of a chip stacked body TA1 by using only the semiconductor chips P1 to P8 that pass this test in the chip stacked body TA1.

Here, three through electrodes 94 are connected to one front-surface test pad 93, and one probe pin 121 is brought into contact with three back-surface test pad 96 at the same time, such that it is possible to reduce the load applied to one through electrode 94, and to reduce damage of the through electrode 94, as compared with the case of receiving the load of one probe pin 121 by two or one back-surface test pads 96. Furthermore, since one probe pin 121 is connected to three back-surface test pads 96, it is possible to increase the elastic force of the spring 123, and to reduce the occurrence of contact failures due to non-return of the spring 123, while making the load applied on the through electrode 94 the same as the case of receiving a load of one probe pin 121 by two or fewer back-surface test pads 96.

Further, due to a difference in thermal expansion coefficients between the probe card 120 and the semiconductor chip P11, a distance between the probe pins 121 on the probe card 120 and a distance between the front-surface test pads 93 on the semiconductor chip P11 may deviate. Also in this case, three through electrodes 94 which are connected to one front-surface test pad 93 are arranged on the apex of a virtual triangle, such that it is possible to always make one probe pin 121 contact the three back-surface test pads 96 at the same time, and it is possible to equalize the load applied to the one through electrode 94, as compared with the case of receiving the load of one probe pin 121 by four or more back-surface test pads 96.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device comprising:
a semiconductor layer;
an insulating layer located on the semiconductor layer;
a multilayer wiring, including a top layer wiring, an upper layer wiring, and a bottom layer wiring, the bottom layer wiring being located on the insulating layer;
a through electrode extending through the semiconductor layer and in direct contact with the bottom layer wiring of the multilayer wiring;
a first via and a second via directly connecting the top layer wiring to the upper layer wiring, the first via and the second via being located at a position other than a position immediately overlying the through electrode; and
a third via and a fourth via electrically connecting the upper layer wiring to the bottom layer wiring, the third via and the fourth via being located at a position other than a position immediately overlying the through electrode.

2. The semiconductor device according to claim 1, wherein
the bottom layer wiring comprises a stacked structure in which a plurality of conductive layers having one or more electrical resistances are stacked, and
the through electrode terminates on or in the conductive layer having the lowest resistance among the plurality of conductive layers in the stacked structure.

3. The semiconductor device according to claim 2, wherein the conductive layer having the lowest resistance among the plurality of conductive layers comprises at least one of tungsten, aluminum, copper, nickel silicide, cobalt silicide and manganese.

4. The semiconductor device according to claim 3, further comprising:
a lower layer wiring; and
a fifth via extending between and electrically connecting the upper layer wiring to the lower layer wiring in a location overlying the through electrode.

5. The semiconductor device according to claim 4, further comprising an interlayer insulating film, wherein the lower layer wiring, the upper layer wiring, and the bottom layer wiring are in the interlayer insulating film.

6. The semiconductor device according to claim 5, wherein an inorganic protective layer is in contact with the interlayer insulating film.

7. The semiconductor device according to claim 1, wherein:
an inorganic protective film overlies and is in contact the top layer wiring.

8. The semiconductor device according to claim 7, further comprising a front surface electrode disposed through the inorganic protective film and in contact with the top layer wiring.

9. The semiconductor device of claim 1, wherein the semiconductor layer comprises one or more of Si, Ge, SiGe, GaAs, AlGaAs, InP, GaP, InGaAs, GaN, and SiC.

10. The semiconductor device according to claim 1, wherein
the third via is vertically aligned with the first via, and
the fourth via is vertically aligned with the second via.

11. The semiconductor device according to claim 1, further comprising a gate electrode located above the semiconductor layer, wherein the bottom layer wiring and the gate electrode comprise the same material.

12. The semiconductor device according to claim 1, further comprising an isolation layer formed in the semiconductor layer, wherein the insulating layer is located on the isolation layer.

13. A semiconductor device comprising:
a semiconductor layer;
an isolation layer in the semiconductor layer;
an insulating layer on the isolation layer;
a multilayer wiring, including a bottom layer wiring, a top layer wiring and an upper layer wiring, on the insulating layer;
an interlayer insulating film, wherein the lower layer wiring, the upper layer wiring, and the bottom layer wiring are in the interlayer insulating film;
an inorganic protective layer disposed over and in contact with the top layer wiring and the interlayer insulating film;
a front surface electrode disposed through the inorganic protective film and in contact with the top layer wiring;
a gate electrode located above the semiconductor layer, wherein the gate electrode and the bottom layer wiring comprise the same material; and
a through electrode extending through the semiconductor layer and in direct contact with the bottom layer wiring of the multilayer wiring;
a first via and a second via directly connecting the top layer wiring to the upper layer wiring, the first via and the second via being located at a position other than a position immediately overlying the through electrode; and
a third via and a fourth via electrically connecting the upper layer wiring to the bottom layer wiring, the third via and the fourth via being located at a position other than a position immediately overlying the through electrode.

14. The semiconductor device according to claim 13, further comprising:
a lower layer wiring; and
a fifth via extending between and electrically connecting the upper layer wiring to the lower layer wiring in a location overlying the through electrode.

15. The semiconductor device according to claim 14, wherein the inorganic protective layer comprises silicon nitride.

16. The semiconductor device according to claim 15, further comprising an organic protective layer disposed on and in contact with inorganic protective layer.

17. The semiconductor device according to claim 16, wherein the front surface electrode is disposed through an opening of the organic protective layer.

18. The semiconductor device of claim 13, wherein the semiconductor layer comprises one or more of Si, Ge, SiGe, GaAs, AlGaAs, InP, GaP, InGaAs, GaN, and SiC.

* * * * *